United States Patent
Chen et al.

(10) Patent No.: US 6,433,521 B1
(45) Date of Patent: Aug. 13, 2002

(54) SOURCE AND SINK VOLTAGE REGULATOR USING ONE TYPE OF POWER TRANSISTOR

(75) Inventors: An-Tung Chen, Tao-Yuan; Yung-Peng Hwang, Taipei, both of (TW)

(73) Assignee: Windbond Electronics Corporation (TW)

( * ) Notice: Subject to any disclaimer, the term of this patent is extended or adjusted under 35 U.S.C. 154(b) by 0 days.

(21) Appl. No.: 09/920,630

(22) Filed: Aug. 3, 2001

(51) Int. Cl.[7] .................................................. H02J 1/02
(52) U.S. Cl. ........................................ 323/224; 323/267
(58) Field of Search .............................. 323/220, 224, 323/267, 271, 282, 316

(56) References Cited

U.S. PATENT DOCUMENTS

| | | | | |
|---|---|---|---|---|
| 3,675,114 A | * | 7/1972 | Nercessian | 323/267 |
| 4,415,843 A | * | 11/1983 | Feldman | 318/139 |
| 5,608,312 A | * | 3/1997 | Wallace | 323/224 |
| 5,966,004 A | * | 10/1999 | Kadanka | 323/271 |

* cited by examiner

Primary Examiner—Adolf Deneke Berhane

(57) ABSTRACT

The present invention provides a regulator used in an active terminator of a bus. The regulator comprises a voltage-regulated terminal, a first operational amplifier and a non-inverting input terminal thereof coupled to a reference voltage. An inverting input terminal of a second operational amplifier is coupled to the reference voltage. A control gate of a first transistor is coupled to an output terminal of the first operational amplifier. A source of the first transistor is coupled to an inverting input terminal of the first operational amplifier to form a feedback network and to provide a stable circuit of sourcing current. A control gate of a second transistor is coupled to an output terminal of the second operational amplifier and a drain of the second transistor to a non-inverting input terminal of the second operational amplifier to form the feedback network and to provide a stable circuit of sinking current. The prevent invention prevents from utility of complementary output power transistors and shoot-through current.

19 Claims, 4 Drawing Sheets

SOURCE AND SINK VOLTAGE REGULATOR USING ONE TYPE OF POWER TRANSISTOR

BACKGROUND OF THE INVENTION

1. Field of the Invention

The invention relates to a voltage regulator, and more particularly to a voltage regulator for a terminator, which enables source and sink current by utilizing one type of output power transistor.

2. Description of the Prior Art

Computer systems typically use an electronic bus to communicate signals between various computing devices such as processors, memories, and input/output (I/O) devices. A computer bus commonly communicates addresses, data, and control signals between the computing devices connected thereto. The signals are typically driven on the bus by drivers incorporated into each of the connected computing devices.

A common computer peripheral interface, for example, is the Small Computer Systems Interface (SCSI) which can reduces the I/O bottleneck in existed computer systems. However, as the data rates over the SCSI bus increase, the effects of transmission line associated with the SCSI bus degrade the integrity of the data transmitted over the bus. Thus, termination for the bus has become a critical design factor due to the increases in data rates, the potential distances between SCSI stubs, differences in cable design and other factors. For example, due to impedance mismatches on the SCSI bus, the acknowledge and request control signals may be reflected such that the acknowledge and request lines be double clocked. One reason of signal reflection is due to mismatches between cables having slightly different impedances.

Impedance mismatches can be resolved by using a terminator for a bus. The terminator provides the signals of a bus with both a termination resistor ($R_t$) for matching characteristic impedance of the transmission line and a termination voltage ($V_o$) for assisting driving circuit to reduce the driven loading of a bus, shown in FIG. 1.

Generally, the types of terminator include passive and active. Shown in FIG. 2 is a typically passive terminator 100, which provides an equivalent termination resistance being $R_1 * R_2/(R_1+R_2)$ and an equivalent termination voltage being $V_p * R_2/(R_1+R_2)$. One of disadvantages of the passive terminator 100 is the problem of power dissipation. The passive terminator 100 provides a constant current path between the terminator power line 106 and ground even when the signal line of bus 102 is not active (i.e., at high impedance), resulting in continuous power dissipation.

An active terminator, such as the Boulay terminator 200 shown in FIG. 3, provides the potential reduction of reflection problems caused by impedance mismatches on the bus. In general, active terminators in the prior art attempt to reduce the reflection by compensating for voltage drops and maintaining a constant stable voltage to the terminating equipment resistors. In Boulay terminator 200, $R_t$ provides a termination resistance and voltage regulator 210 provides a terminator voltage $V_o$. For application[s] on high-speed buses, such as SSTL_2 bus (Stub Series Terminated Logic for 2.5 volts) of symmetric drive that is used in DDR DRAM, it is necessary for voltage regulator 210 to enable to source and sink currents from a terminator voltage. In general, synchronous rectified switch mode regulator enables to source and sink currents. However, it needs a complicated circuit, high cost, and has a disadvantage of switching noise.

Shown in FIG. 4 is a bus with a bi-directional-current conventional linear voltage regulator disclosed in U.S. Pat. No. 5,945,814 of Covaro. To be specified, the block diagram of FIG. 4 is amended according to the types of devices disclosed in FIG. 5 of Covaro. The bipolar transistors named "MMBT3904LT1" and "MJD31C" are NPN transistors and "MJD32C" is a PNP one, which all are manufactured by ON Semiconductor™ company. That is, there are two types of output power transistors (NPN and PNP) are used in Covaro's invention.

Shown in FIG. 5 is another bi-directional-current linear voltage regulator disclosed in U.S. Pat. No. 5,608,312 of Wallace. Output power CMOS devices (NMOS and PMOS) are necessary for Wallace's invention. However, for consideration of easy manufacture, stockpile and cost, single-type output power MOS, especially NMOS, is desired to be utilized in the linear voltage regulator.

Depicted in FIG. 6 is an output voltage regulator of totem-pole type with NMOS device as an output power device. Such a voltage regulator enables to source and sink currents with the suitable settings of a bias. However, it is disadvantageous to provide the narrow ranges of bias settings according to the adjustment of threshold voltage of a specific output power NMOS device. Thus, the narrow ranges of bias settings make differences in the selection of output power NMOS device. Furthermore, the problem of shoot-through current may happen in such a circuit desire on a condition of the output power NMOS device with variable characteristics.

Accordingly, a linear voltage regulator applied to active terminator is necessary to enable sourcing and sinking currents, and further applying only single-type output power transistors with permission of large variation on the characteristics.

SUMMARY OF THE INVENTION

It is one object of the present invention to provide a voltage regulator for terminating a bus. The regulator enables to source and sink a current, to and from, the bus.

It is another object of the present invention to provide a source and sink voltage regulator for terminating a bus. The voltage regulator utilizes single-type output power transistors, such as NMOS for all of output power transistors, as output power devices.

It is another object of the present invention to provide a linear voltage regulator applied on the active terminator of a bus. The linear voltage regulator can prevent shoot-through current and permit applying the output power transistors that have diverse perturbation of the threshold voltage.

In the present invention, a voltage regulator for terminating a bus comprises a voltage-regulated terminal for providing a regulated output voltage to terminal resistors of the bus. A NMOS transistor of common-drain configuration is for sourcing a first current, via the voltage-regulated terminal, to the terminal resistors of the bus. A source of the NMOS transistor of common-drain configuration is coupled to the voltage-regulated terminal and a gate of the NMOS transistor of common-drain configuration is for receiving a control input of a first operational amplifier. The NMOS transistor of common-drain configuration provides a non-inverting amplification. A NMOS transistor of common-source configuration is for sinking a second current, via the voltage-regulated terminal, from the bus. A transistor of common-source configuration is coupled to the voltage-regulated terminal and a gate of the NMOS transistor of common-source configuration is for receiving a control output of a second operational amplifier. The NMOS transistor of common-source configuration provides an inverting amplification. The first operational amplifier is operated as a non-inverting amplifier and formed a first non-inverting combination circuit with the NMOS transistor of common-drain configuration. With the comparison of an input reference voltage and a negative feedback voltage of the voltage-regulated terminal through a divider circuit of a feedback network, the first operational amplifier outputs the control output of the first operational amplifier into the NMOS transistor of common-drain configuration. The second operational amplifier is operated as an inverting amplifier and formed a second non-inverting combination circuit with the NMOS transistor of common-source configuration. With the comparison of the input reference voltage and the negative feedback voltage of the voltage-regulated terminal through a divider circuit of the feedback network, the second operational amplifier outputs the control output of the second operational amplifier into the NMOS transistor of common-source configuration.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

Figure 1:
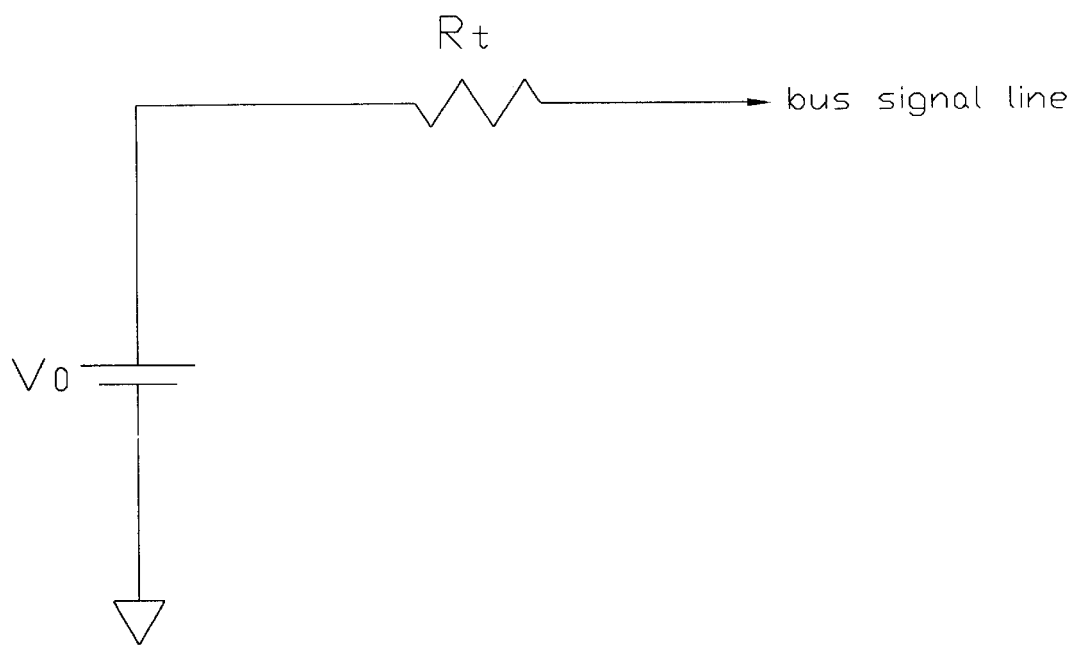
FIG. 1 is a circuit diagram of the terminator of a bus in accordance with the prior art.
Figure 2:
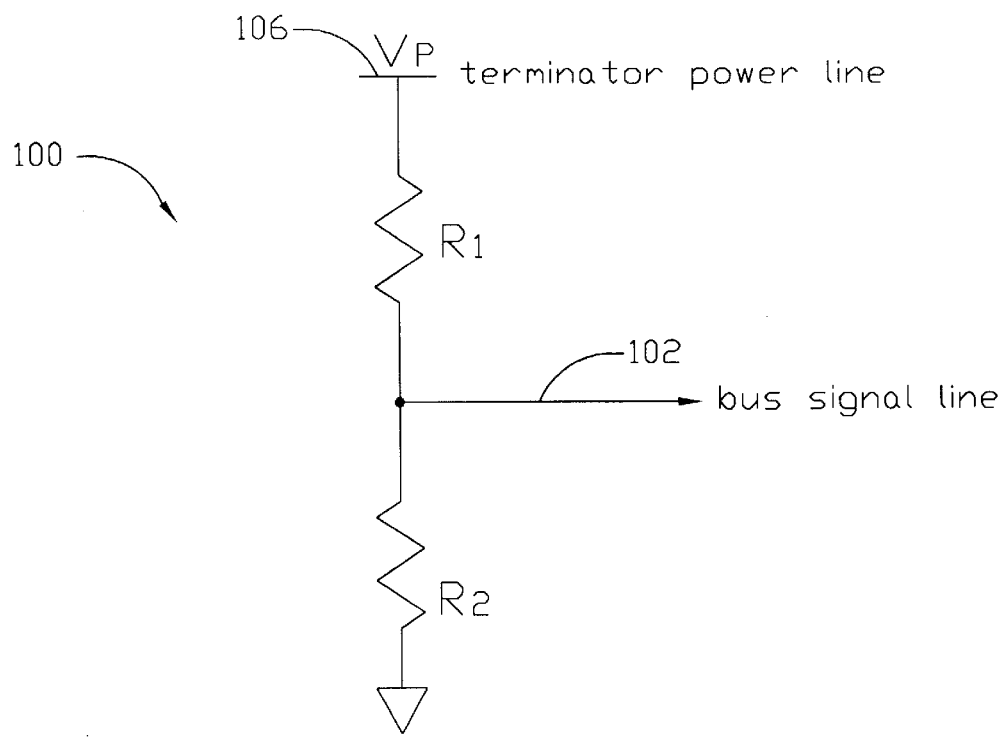
FIG. 2 is a circuit diagram of the passive terminator of a bus in accordance with the prior art.
Figure 3:
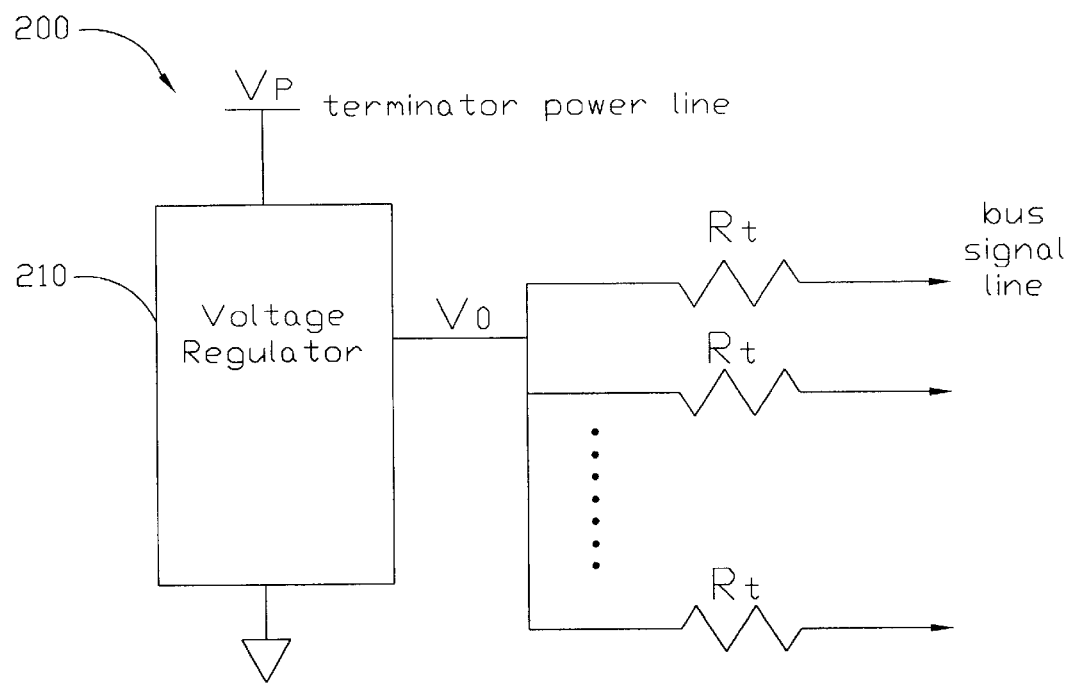
FIG. 3 is a circuit diagram of the active terminator of a bus in accordance with the prior art.
Figure 4:
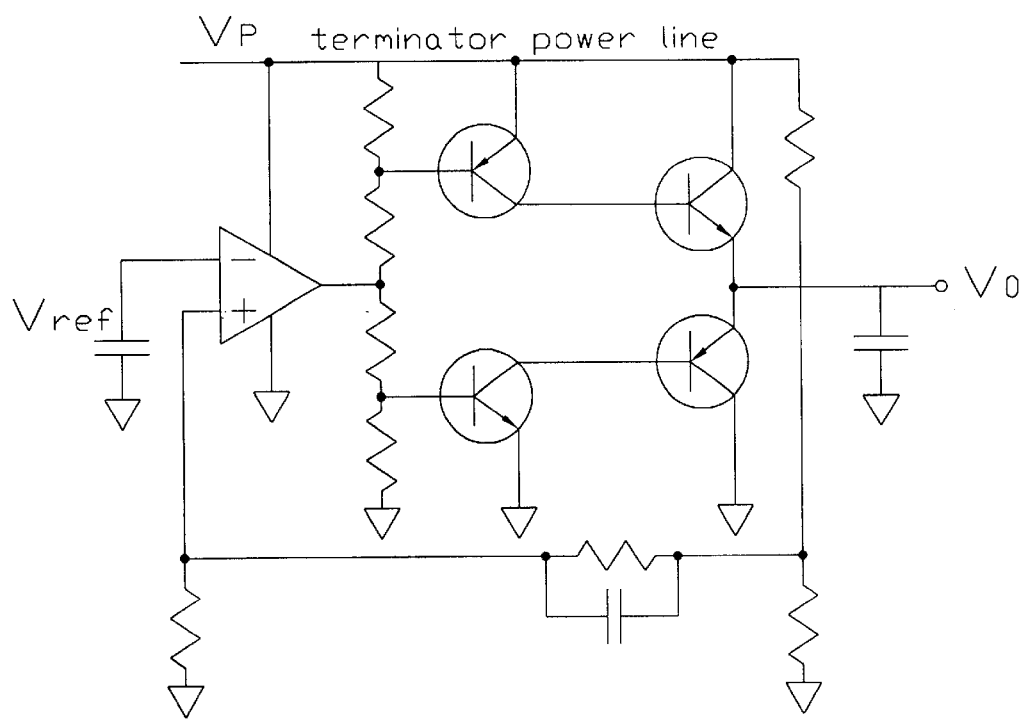
FIG. 4 is a circuit diagram of bi-directional-current linear voltage regulator used for a bus in accordance with the prior art.
Figure 5:
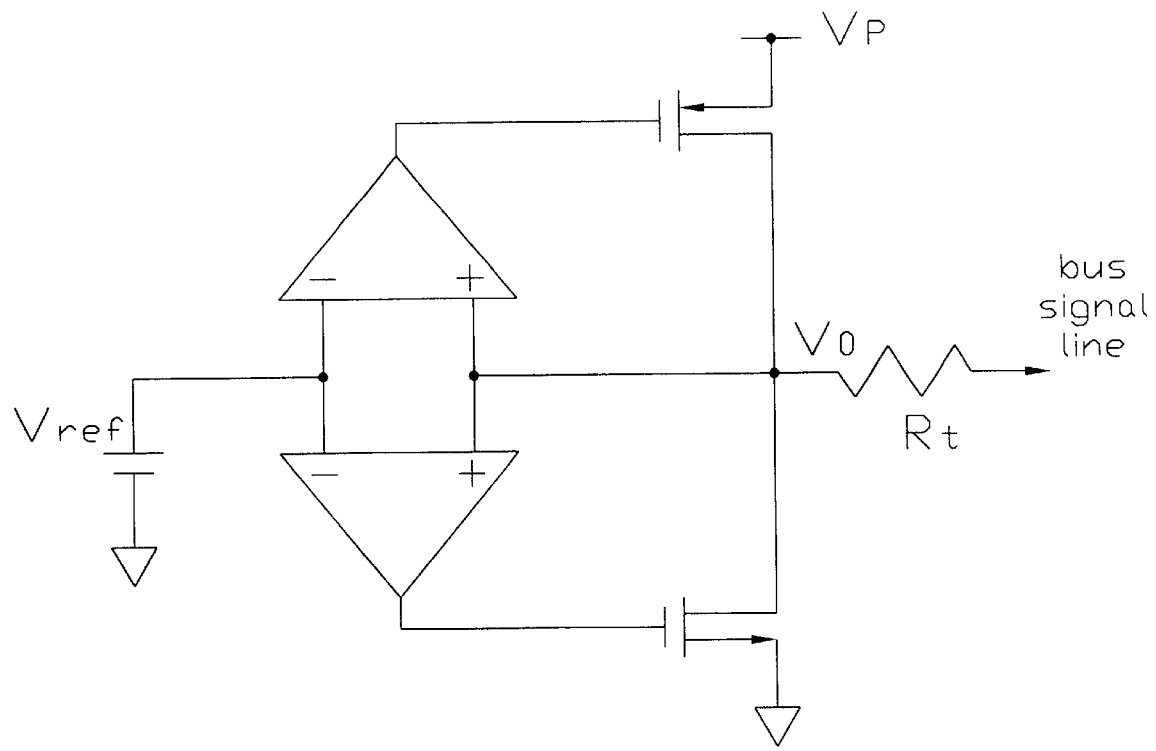
FIG. 5 is another circuit diagram of bi-directional-current linear voltage regulator used for a bus in accordance with the prior art.
Figure 6:
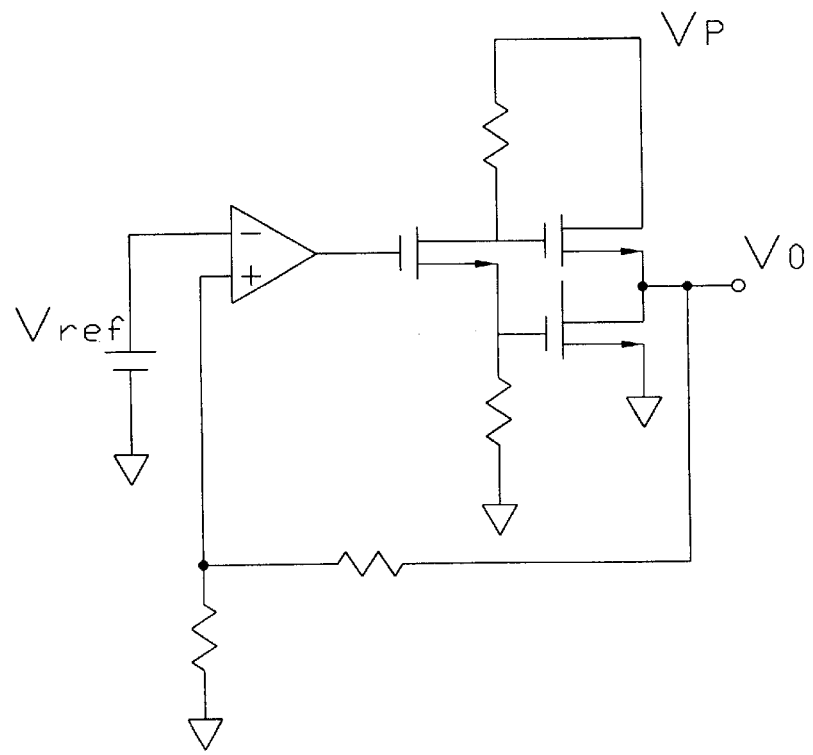
FIG. 6 is a circuit diagram of totem-pole voltage regulator in accordance with the prior art.

While the invention is particularly shown and described with reference to the following preferred embodiment, it will be understood by those skilled in the art that many other modifications and variations may be made thereto without departing from the broader spirit and scope of the invention as set forth in the claims. Use of the disclosed structure or method is not limited to linear voltage regulator device used in the terminator of a bus, but may also be used in fabricating other types of regulator devices with equal architectures. The specification and drawings are according to be regarded as being illustrative, rather than being restrictive.

In the present invention, a voltage regulator for terminating a bus comprises a voltage-regulated terminal for providing a regulated output voltage to the terminal resistors of the bus. A NMOS transistor of common-drain configuration (a sourcing NMOS) is for sourcing a first current, via the voltage-regulated terminal, to the terminal resistors of the bus. A source of the NMOS transistor of common-drain configuration is coupled to the voltage-regulated terminal and a gate of the NMOS transistor of common-drain configuration is for receiving a control output of a first operational amplifier. The NMOS transistor of common-drain configuration provides a non-inverting amplification. A NMOS transistor of common-source configuration (a sinking NMOS) is for sinking a second current, via the voltage-regulated terminal, from the terminal resistors of the bus. A drain of the NMOS transistor of common-source configuration is coupled to the voltage-regulated terminal and a gate of the NMOS transistor of common-source configuration is for receiving a control output of a second operational amplifier. The NMOS transistor of common-source configuration provides an inverting amplification. The first operational amplifier is operated as a non-inverting amplifier and formed a first non-inverting combination circuit with the NMOS transistor of common-drain configuration. With the comparison of the input reference voltage and the negative feedback voltage of the voltage-regulated terminal through a divider circuit of a feedback network, the first operational amplifier outputs the control output of the first operational amplifier into the NMOS transistor of common-drain configuration. The second operational amplifier is operated as an inverting amplifier and formed a second non-inverting combination circuit with the NMOS transistor of common-source configuration. With the comparison of the input reference voltage and the negative feedback voltage of the voltage-regulated terminal through the divider circuit of the feedback network, the second operational amplifier outputs the control output of the second operational amplifier into the NMOS transistor of common-source configuration. To prevent the asserting of the two NMOS transistor that is caused by any input offset voltage randomly generated by any one of the two operational amplifiers from shoot-through current, a first offset voltage is inserted between the input reference voltage and the non-inverting terminal of the first operational amplifier. Furthermore, a second offset voltage is inserted between the input reference voltage and the inverting terminal of the second operational amplifier. The polarity of the first offset voltage enables the non-inverting terminal of the first operational amplifier to accept a voltage equal to the input reference voltage subtracting from the first offset voltage. On the other hand, the polarity of the second offset voltage enables the inverting terminal of the second operational amplifier to accept a voltage equal to the input reference voltage adding up the second offset voltage. Thus, the NMOS transistor of common-drain configuration is asserted only when the regulated output voltage is fewer than a first critical voltage. The NMOS transistor of common-source configuration is asserted only when the regulated output voltage is greater than a second critical voltage. The second critical voltage is greater than the first critical voltage. Thus, the present invention prevents the two NMOS transistors from simultaneously being asserted to generate the shoot-through current.

Figure 7:
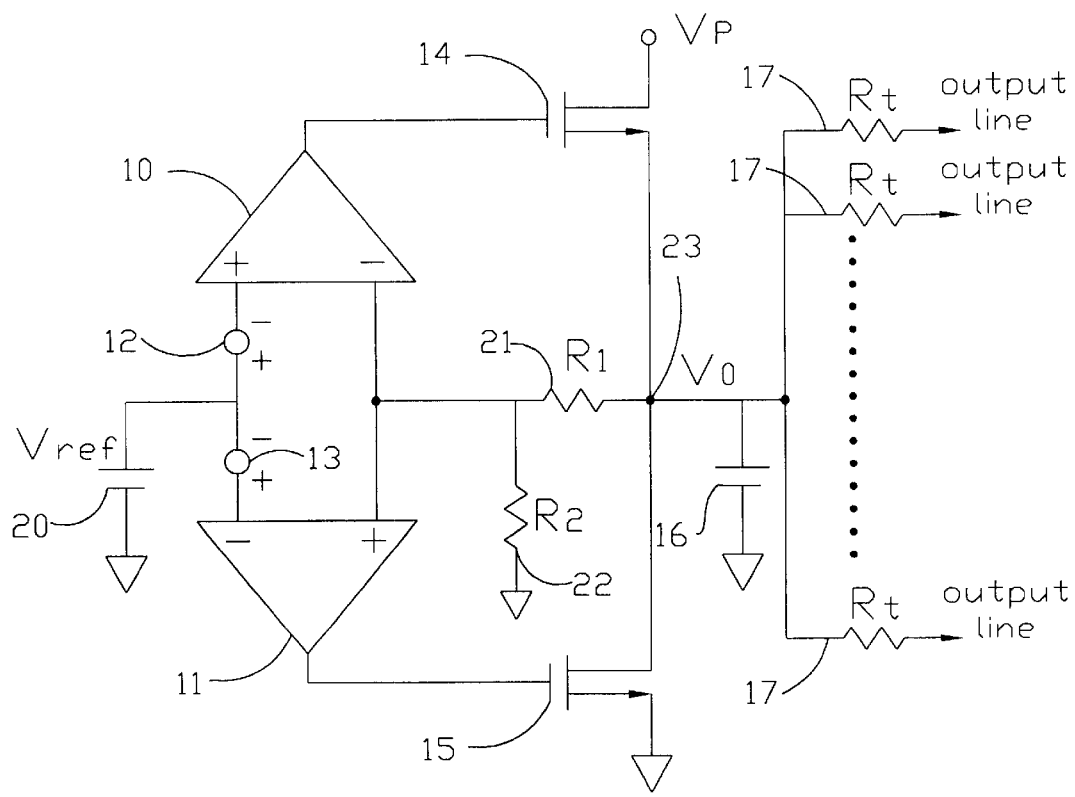
FIG. 7 is a circuit diagram of the linear voltage regulator illustrating an embodiment in accordance with the present invention.

As an example of such a circuit, FIG. 7 illustrates a schematic diagram of a linear voltage regulator in accordance with the present invention. A drain terminal of a first output power device 14, such as an N-type MOS transistor, is coupled to a terminator power supply $V_p$. A gate terminal of the first output power device 14 is coupled to an output terminal of a first operational amplifier device 10. A source terminal of the first output power device 14 is coupled to multitudes of output lines, such as bus lines (not shown), through terminal resistors 17 ($R_t$) and to an inverting input terminal of the first operational amplifier device 10 through a feedback network that includes a first resistor 21 ($R_1$) and a second resistor 22 ($R_2$). The first resistor 21 and the second resistor 22 are regarded as divider resistors.

Similarly, the source terminal of a second output power device 15, such as the source terminal of an N-type MOS transistor, is coupled to a ground terminal. The gate terminal of the second output power device 15 is coupled to the output terminal of a second operational amplifier device 11. The drain terminal of the second output power device 15 is coupled not only to the multitudes of the output lines through the terminal resistors 17, but also to the non-inverting input terminal of the second operational amplifier device 11 through the feedback network that also includes the first resistor 21 and the second resistor 22.

To be specific, the first output power device 14 for sourcing a current to the terminal resistors 17 and the second output power device 15 for sinking a current from the terminal resistors 17 are same type semiconductor output power devices. That is, only one type of the semiconductor output power devices is used in the present invention. For example, N-type NOS transistor (NMOS) or NPN bipolar transistor is used for all of the power devices. It is advantageous for designs to select signal-type semiconductor devices such that manufacturers flexibly prepare stock-in-trade. Furthermore, manufacturers may select the semiconductor devices of lower price.

Furthermore, in this embodiment, the inverting input terminal of the first operational amplifier device 10 is coupled to the non-inverting input terminal of the second operational amplifier device 11. The non-inverting input terminal of the first output amplifier device 10 is coupled to a reference voltage generator 20 through a first offset voltage device 12 in series. The inverting input terminal of the second operational amplifier device 11 is also coupled to the reference voltage generator 20 through a second offset voltage device 13 in series. Both the first offset voltage device 12 and the second offset voltage device 13 provide individual offset values $V_{off1}$ and $V_{off2}$ to the first operational amplifier device 10 and the second operational amplifier device 11. Generally, these offset values can be generated by adjusting the input offset of any operational amplifier device, rather than by an exterior power device. In the embodiment, the non-inverting input terminal of the first operational amplifier device 10 is inputted a voltage value equal to a referenced voltage value subtracting from the offset voltage value $V_{off1}$. The inverting input terminal of the second operational amplifier device 11 is inputted a voltage value equal to the reference voltage value in addition of the offset value $V_{off2}$. Each of the offset values may be as much as mV. The addition of the first offset voltage device 12 and the second offset voltage device 13 enables to prevent shoot-through current.

For analysis according to general feedback theory, when the open-loop gain of an operational amplifier is great enough (typically larger that 10000), the combination of the first operational amplifier device 10 and the first output power device 14 (NMOS transistor of common-drain configuration) can output a stable voltage value of $(V_{ref}-V_{off1})*((R_1+R_2)/R_2)$(the first critical voltage). When a current is sourced into the terminal resistors to result in the output voltage value $V_o$ of an output terminal 23 smaller than $(V_{ref}-V_{off1})*((R_1+R_2)/R_2)$, the first output power device 14 is turned on and provides a current to the output terminal 23 to raise the output voltage value $V_o$. Alternatively, the first output power device 14 is turned off and the output of the first operational amplifier 10 is zero when the output voltage value $V_o$ is greater than $(V_{ref}-V_{off1})*((R_1+R_2)/R_2)$.

On the other hand, the combination of the second operational amplifier device 11 and the second output power device 15 (NMOS transistor of common-source configuration) can output another stable voltage value of $(V_{ref}+V_{off2})*((R_1+R_2)/R_2)$(the second critical voltage). When a current is sunk from the terminal resistors to result in the output voltage value $V_o$ of an output terminal 23 greater than $(V_{ref}+V_{off2})*((R_1+R_2)/R_2)$, the second power device 15 is turned on and sinks a current from the output terminal 23 to lower the output voltage value $V_o$. Alternatively, the second output power device 15 is turned off and the output of the second operational amplifier 11 is zero when the output voltage value $V_o$ is smaller than $(V_{ref}+V_{off2})*((R_1+R_2)/R_2)$. Furthermore, due to $(V_{ref}-V_{off1})*((R_1+R_2)/R_2)$ definitely smaller than $(V_{ref}+V_{off2})*((R_1+R_2)/R_2)$, the first output power device 14 and the second output power device 15 are not turned on simultaneously, thus the condition of shoot-through current from the terminal Vp to ground doesn't happen.

On another condition of the output voltage value $V_o$ between $(V_{ref}+V_{off2})*((R_1+R_2)/R_2)$ and $(V_{ref}-V_{off1})*((R_1+R_2)/R_2)$, both the first output power device 14 and the second output power device 15 are off. A capacitor 16 is responsible to provide low impedance of AC signal from the voltage-regulated terminal to ground.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A source and sink voltage regulator used in an active terminator of a bus, said regulator comprising:

a voltage-regulated terminal for providing a regulated output voltage;

a first operational amplifier, a non-inverting input terminal of said first operational amplifier coupled to a reference voltage;

a second operational amplifier, an inverting input terminal of said second operational amplifier coupled to said reference voltage;

a first transistor, a control gate of said first transistor coupled to an output terminal of said first operational amplifier, a source of said first transistor coupled to said voltage regulated terminal and an inverting input terminal of said first operational amplifier via a feedback network, and a stable circuit of sourcing current provided by a combination of said first transistor and said first operational amplifier; and a second transistor which belongs to a type the same as said first transistor, a control gate of said second transistor coupled to an output terminal of said second operational amplifier, a drain of said second transistor coupled to said voltage regulated terminal and a non-inverting input terminal of said second operational amplifier via said feedback network, and a stable circuit of sinking current provided by a combination of said second transistor and said second operational amplifier.

2. The regulator of claim 1 further comprising a first offset voltage coupled between said reference voltage and said non-inverting input terminal of said first operational amplifier, whereby inputs a first offset into said non-inverting input terminal of said first operational amplifier, and polarity of said first offset enabling said non-inverting input terminal of said first operational amplifier to accept a voltage equal to said reference voltage subtracting from said first offset.

3. The regulator of claim 2 further comprising a second offset voltage coupled between said reference voltage and said inverting input terminal of said second operational amplifier, whereby inputs a second offset into said inverting input terminal of said second operational amplifier, and polarity of said second offset enabling said inverting input terminal of said second operational amplifier to accept a voltage equal to said reference voltage in addition to said second offset.

4. The regulator of claim 1, wherein said feedback network further comprises:
  a first resistor wherein one terminal of said first resistor is coupled to said voltage-regulated terminal and the other terminal of said first resistor is coupled to both said inverting terminal of said first operational amplifier and said non-inverting terminal of said second operational amplifier; and
  a second resistor wherein one terminal of said second resistor is coupled to said first resistor, said inverting terminal of said first operational amplifier and said non-inverting terminal of said second operational amplifier, and the other terminal of said second resistor is grounded.

5. The regulator of claim 1, wherein a drain of said first transistor is coupled to a terminator power supply.

6. The regulator of claim 1, wherein a source of said second transistor is coupled to a ground.

7. The regulator of claim 1, wherein said source of said first transistor is coupled to at least a terminal resistor through said voltage-regulated terminal, whereby said first transistor sources a first current to said terminal resistor.

8. The regulator of claim 7 further comprising said drain of said second transistor is coupled to said terminal resistor through said voltage-regulated terminal, whereby said second transistor sinks a second current from said terminal resistor.

9. The regulator of claim 1, wherein said first transistor and said second transistor are N-type metal-oxide-semiconductor transistors or NPN bipolar transistors.

10. A voltage regulator for terminating a bus, said voltage regulator comprising:
  a voltage-regulated terminal for providing a regulated output voltage to a plurality of terminal resistors of said bus;
  an N-type metal-oxide-semiconductor transistor of common-drain configuration for sourcing a first current, via said voltage-regulated terminal, to said terminal resistors of said bus, said N-type metal-oxide-semiconductor transistor of common-drain configuration asserted only when said regulated output voltage is smaller than a first critical voltage, wherein a source of said N-type metal-oxide-semiconductor transistor of common-drain configuration is coupled to said voltage-regulated terminal and a gate of said N-type metal-oxide-semiconductor transistor of common-drain configuration is for receiving a control output of a first operational amplifier, and said N-type metal-oxide-semiconductor transistor of common-drain configuration providing a non-inverting amplification;
  an N-type metal-oxide-semiconductor transistor of common-source configuration for sinking a second current, via said voltage-regulated terminal, from said terminal resistors of said bus, said N-type metal-oxide-semiconductor transistor of common-source configuration asserted only when said regulated output voltage is greater than a second critical voltage, wherein a drain of said N-type metal-oxide-semiconductor transistor of common-source configuration is coupled to said voltage-regulated terminal and a gate of said N-type metal-oxide-semiconductor transistor of common-source configuration is for receiving a control output of a second operational amplifier, and said N-type metal-oxide-semiconductor transistor of common-source configuration providing an inverting amplification;
  said first operational amplifier operated as a non-inverting amplifier and formed a first non-inverting combination circuit with said N-type metal-oxide-semiconductor transistor of common-drain configuration, whereby outputs said control output of said first operational amplifier by comparing an input reference voltage with a negative feedback voltage from said voltage-regulated terminal via a feedback network; and
  said second operational amplifier operated as an inverting amplifier and formed a second non-inverting combination circuit with said N-type metal-oxide-semiconductor transistor of common-source configuration, whereby outputs said control output of said second operational amplifier by comparing said input reference voltage with said negative feedback voltage from said voltage-regulated terminal via said feedback network.

11. The voltage regulator of claim 10 further comprising a first offset voltage coupled between said reference voltage and said non-inverting input terminal of said first operational amplifier, whereby inputs a first offset into said non-inverting input terminal of said first operational amplifier, and polarity of said first offset enabling said non-inverting input terminal of said first operational amplifier to accept a voltage equal to said reference voltage subtracting from said first offset.

12. The voltage regulator of claim 10 further comprising a second offset voltage coupled between said reference voltage and said inverting input terminal of said second operational amplifier, whereby inputs a second offset into said inverting input terminal of said second operational amplifier, and polarity of said second offset enabling said inverting input terminal of said second operational amplifier to accept a voltage equal to said reference voltage in addition to said second offset.

13. The voltage regulator of claim 10, wherein a drain of said N-type metal-oxide-semiconductor transistor of common-drain configuration is coupled to a terminator power supply.

14. The voltage regulator of claim 10, wherein a source of said N-type metal-oxide-semiconductor transistor of common-source configuration is coupled to a ground.

15. The voltage regulator of claim 10, wherein said source of said N-type metal-oxide-semiconductor transistor of common-drain configuration is coupled, via said voltage-regulated terminal, to said terminal resistors, whereby said N-type metal-oxide-semiconductor transistor of common-drain configuration sources said first current to said terminal resistors.

16. The voltage regulator of claim 15 further comprising said drain of said N-type metal-oxide-semiconductor transistor of common-source configuration is coupled, via said voltage-regulated terminal, to said terminal resistors, whereby said N-type metal-oxide-semiconductor transistor of common-source configuration sinks said second current from said terminal resistors.

17. The regulator of claim 10, wherein said feedback network further comprises:

a first resistor wherein one terminal of said first resistor is coupled to said voltage-regulated terminal and the other terminal of said first resistor is coupled to both said inverting terminal of said first operational amplifier and said non-inverting terminal of said second operational amplifier; and a second resistor wherein one terminal of said second resistor is coupled to said first resistor, said inverting terminal of said first operational amplifier and said non-inverting terminal of said second operational amplifier, and the other terminal of said second resistor is grounded.

18. The regulator of claim 10 further comprising a capacitor coupled to said voltage-regulated terminal, said capacitor responsible to provide a low impedance of AC signal.

19. The regulator of claim 10, wherein said first critical voltage is smaller than said second critical voltage.

* * * * *